United States Patent
Chen et al.

(10) Patent No.: US 10,097,223 B2
(45) Date of Patent: Oct. 9, 2018

(54) LOW POWER SUPPLY VOLTAGE DOUBLE-CONVERSION RADIO FREQUENCY RECEIVING FRONT END

(71) Applicant: Southeast University, Jiangsu (CN)

(72) Inventors: Chao Chen, Jiangsu (CN); Jianhui Wu, Jiangsu (CN); Hong Li, Jiangsu (CN)

(73) Assignee: Southeast University, Jiangsu (CN)

( * ) Notice: Subject to any disclaimer, the term of this patent is extended or adjusted under 35 U.S.C. 154(b) by 0 days.

(21) Appl. No.: 15/509,202

(22) PCT Filed: Jan. 29, 2016

(86) PCT No.: PCT/CN2016/072750
§ 371 (c)(1),
(2) Date: Mar. 7, 2017

(87) PCT Pub. No.: WO2017/101202
PCT Pub. Date: Jun. 22, 2017

(65) Prior Publication Data
US 2018/0115335 A1   Apr. 26, 2018

(30) Foreign Application Priority Data
Dec. 14, 2015 (CN) .......................... 2015 1 0925487

(51) Int. Cl.
H04B 1/26 (2006.01)
H04B 1/16 (2006.01)
H03F 3/45 (2006.01)

(52) U.S. Cl.
CPC ........... *H04B 1/16* (2013.01); *H03F 3/45475* (2013.01); *H03F 2203/45116* (2013.01); *H03F 2203/45288* (2013.01)

(58) Field of Classification Search
CPC .................................................. H03F 3/45475
USPC ........................................................ 455/326
See application file for complete search history.

(56) References Cited

U.S. PATENT DOCUMENTS 9,148,186 B1 * 9/2015 Wu ........................ H04B 1/123

FOREIGN PATENT DOCUMENTS

CN             103078593           5/2013

\* cited by examiner

*Primary Examiner* — Sanh D Phu
(74) *Attorney, Agent, or Firm* — JCIPRNET

(57) ABSTRACT

The present invention discloses a low power supply voltage double-conversion radio frequency receiving front end, which can work at a lower power supply voltage in a passive frequency conversion mode; a first frequency conversion unit and a second frequency conversion unit of the front end are directly cascaded, and a second orthogonal passive frequency conversion shifts a low input impedance of a transimpedance amplifier to an intermediate frequency, so as to construct a band-pass filtering function for radio frequency current; and the radio frequency current which has undergone two frequency conversions is converted into an output intermediate frequency voltage via the transimpedance amplifier. Compared with the traditional active+active or active+passive double conversion mode, the present invention omits intermediate-stage active circuits and filtering circuits, thereby saving power consumption and layout area, and realizing sufficient rejection on an image signal while ensuring a high conversion gain.

3 Claims, 2 Drawing Sheets

LOW POWER SUPPLY VOLTAGE DOUBLE-CONVERSION RADIO FREQUENCY RECEIVING FRONT END

CROSS-REFERENCE TO RELATED APPLICATION

This application is a 371 application of the International PCT application serial no. PCT/CN2016/072750, filed on Jan. 24, 2016, which claims the priority benefit of China application no. 201510925487.9, filed on Dec. 14, 2015. The entirety of each of the above-mentioned patent applications is hereby incorporated by reference herein and made a part of this specification.

TECHNICAL FIELD

The present invention relates to a double-conversion radio frequency receiving front end circuit for use in a low power supply voltage application of which the power supply voltage can be as low as 0.6 V.

BACKGROUND

The rapid popularization of the hand-held wireless communication terminal device raises higher requirements for the power consumption of the radio frequency receiving module. The structure of a double-conversion receiver uses two frequency conversions, and achieves good performances in both the image rejection and power consumption aspects, so that it is widely used in the low power consumption radio frequency receiving circuits. Most traditional double-conversion radio frequency front ends use combinations of active and passive frequency mixing, wherein band-pass filtering is performed after a first frequency conversion, and then a receiving signal is shifted to a base band by means of a second orthogonal frequency conversion.

In recent years, with the continuous decreasing of process dimension and increasing drive towards low power consumption, designers start to try a design method for a radio frequency receiving circuit in a near-threshold voltage condition. For the traditional double-conversion radio frequency receiving front ends, when the power supply voltage decreases below 0.6 V, it is very difficult for an active frequency-mixing circuit therein to obtain sufficient voltage margin.

SUMMARY

Objectives of the invention: In order to overcome the deficiencies existing in the art, the present invention provides a low power supply voltage double-conversion radio frequency receiving front end, which uses an impedance shifting effect of the passive frequency conversion to construct a band-pass filtering effect after a first-stage frequency mixing, so as to directly cascade two stages of passive frequency conversion, so that the present invention realizes sufficient rejection on an image signal while ensuring a high conversion gain, and has the characteristics of a simple circuit structure and a low power consumption.

Technical solutions: In order to achieve the above objectives, the technical solution adopted in the present invention is as follows:

a low power supply voltage double-conversion radio frequency receiving front end, comprising a low voltage radio frequency transconductance amplifier, a pair of double-conversion frequency mixing switches and a transimpedance amplifier, wherein the double-conversion frequency mixing switches directly cascade a first frequency conversion unit and a second frequency conversion unit, the second frequency conversion unit shifting low input impedance of the transimpedance amplifier to an intermediate frequency, so as to construct a band-pass filtering function for radio frequency current; and the radio frequency current which has undergone two frequency conversions is converted into an output intermediate frequency voltage via the transimpedance amplifier. The front end of the present invention eliminates intermediate-stage buffer and filtering circuits, thereby further reducing the power consumption and the layout area; and the present invention realizes sufficient rejection on an image signal while ensuring a high conversion gain.

In particular, said low voltage radio frequency transconductance amplifier comprises a first NMOS transistor MN1, a second NMOS transistor MN2, a third NMOS transistor MN3, a first PMOS transistor MP1, a second PMOS transistor MP2, a first capacitor C1, a second capacitor C2, a third capacitor C3, a fourth capacitor C4, a fifth capacitor C5, a first resistor R1 a second resistor R2, a third resistor R3, a fourth resistor R4, a fifth resistor R5, a sixth resistor R6, a first reference current source I1 and a second reference current source I2;

a gate electrode and a drain electrode of the first NMOS transistor MN1 are short-connected, and a source electrode is grounded;

a source electrode of the second NMOS transistor MN2 is grounded, a gate electrode is connected to a positive electrode of the fifth resistor R5, and a drain electrode is connected to a drain electrode of the first PMOS transistor MP1; a negative electrode of the fifth resistor R5 is connected to the drain electrode of the first NMOS transistor MN1;

a source electrode of the third NMOS transistor MN3 is grounded, a gate electrode is connected to a positive electrode of the sixth resistor R6, and a drain electrode is connected to a drain electrode of the second PMOS transistor MP2; a negative electrode of the sixth resistor R6 is connected to the drain electrode of the first NMOS transistor MN1;

a source electrode of the first PMOS transistor MP1 is connected to a power supply VDD, and a gate electrode is connected to a positive electrode of the first resistor R1;

a source electrode of the second PMOS transistor MP2 is connected to the power supply VDD, and a gate electrode is connected to a positive electrode of the second resistor R2;

a positive electrode of the first capacitor C1 is connected to the drain electrode of the first NMOS transistor MN1, and a negative electrode is grounded;

a positive electrode of the second capacitor C2 is connected to an input voltage positive electrode INP, and a negative electrode is connected to a gate electrode of the third NMOS transistor MN3;

a positive electrode of the third capacitor C3 is connected to an input voltage negative electrode INN, and a negative electrode is connected to the gate electrode of the second NMOS transistor MN2;

a positive electrode of the fourth capacitor C4 is connected to the gate electrode of the second NMOS transistor MN2, and a negative electrode is connected to the gate electrode of the first NMOS transistor MN1;

a positive electrode of the fifth capacitor C5 is connected to the gate electrode of the third NMOS transistor MN3, and a negative electrode is connected to the gate electrode of the second NMOS transistor MN2;

a positive electrode of the first reference current source I1 is connected to the power supply VDD, and a negative electrode is connected to the drain electrode of the first NMOS transistor MN1;

a positive electrode of the second reference current source I2 is connected to a negative electrode of the first resistor R1, a negative electrode of the second resistor R2, a negative electrode of the third resistor R3 and a negative electrode of the fourth resistor R4, and a negative electrode is grounded; and a positive electrode of the third resistor R3 is connected to the drain electrode of the first PMOS transistor MP1, and a positive electrode of the fourth resistor R4 is connected to the drain electrode of the second PMOS transistor MP2.

In particular, said pair of double-conversion frequency mixing switches comprise a sixth capacitor C6, a seventh capacitor C7, an eighth capacitor C8, a fourth NMOS transistor MN4, a fifth NMOS transistor MN5, a sixth NMOS transistor MN6, a seventh NMOS transistor MN7, an eighth NMOS transistor MN8, a ninth NMOS transistor MN9, a tenth NMOS transistor MN10, an eleventh NMOS transistor MN11, a twelfth NMOS transistor MN12, a thirteenth NMOS transistor MN13, a fourteenth NMOS transistor MN14 and a fifteenth NMOS transistor MN15;

a positive electrode of the sixth capacitor C6 is connected to the drain electrode of the first PMOS transistor MP1, and a negative electrode is connected to a source electrode of the sixth NMOS transistor MN6 and a source electrode of the seventh NMOS transistor MN7;

a positive electrode of the seventh capacitor C7 is connected to the drain electrode of the second PMOS transistor MP2, and a negative electrode is connected to a source electrode of the fourth NMOS transistor MN4 and a source electrode of the fifth NMOS transistor MN5;

a positive electrode of the eighth capacitor C8 is connected to a drain electrode of the fifth NMOS transistor MN5 and a drain electrode of the sixth NMOS transistor MN6, and a negative electrode is connected to a drain electrode of the fourth NMOS transistor MN4 and a drain electrode of the seventh NMOS transistor MN7;

a gate electrode of the fourth NMOS transistor MN4 and a gate electrode of the sixth NMOS transistor MN6 are connected to a first local oscillator signal positive electrode LO1+, and a gate electrode of the fifth NMOS transistor MN5 and a gate electrode of the seventh NMOS transistor MN7 are connected to a first local oscillator signal negative electrode LO1−;

the positive electrode of the eighth capacitor C8 is connected to a source electrode of the eighth NMOS transistor MN8 and a source electrode of the ninth NMOS transistor MN9, and the negative electrode is connected to a source electrode of the fourteenth NMOS transistor MN14 and a source electrode of the fifteenth NMOS transistor MN15; a drain electrode of the eighth NMOS transistor MN8 and a drain electrode of the fourteenth NMOS transistor MN14 are short-connected, a drain electrode of the ninth NMOS transistor MN9 and a drain electrode of the fifteenth NMOS transistor MN15 are short-connected, a gate electrode of the eighth NMOS transistor MN8 and a gate electrode of the fifteenth NMOS transistor MN15 are connected to a second Q local oscillator signal positive electrode LO2Q+, and a gate electrode of the ninth NMOS transistor MN9 and a gate electrode of the fourteenth NMOS transistor MN14 are connected to a second Q local oscillator signal negative electrode LO2Q−;

the positive electrode of the eighth capacitor C8 is connected to a source electrode of the tenth NMOS transistor MN10 and a source electrode of the eleventh NMOS transistor MN11, and the negative electrode is connected to a source electrode of the twelfth NMOS transistor MN12 and a source electrode of the thirteenth NMOS transistor MN13; and a drain electrode of the tenth NMOS transistor MN10 and a drain electrode of the twelfth NMOS transistor MN12 are short-connected, a drain electrode of the eleventh NMOS transistor MN11 and a drain electrode of the thirteenth NMOS transistor MN13 are short-connected, a gate electrode of the tenth NMOS transistor MN10 and a gate electrode of the thirteenth NMOS transistor MN13 are connected to a second I local oscillator signal positive electrode LO2I+, and a gate electrode of the eleventh NMOS transistor MN11 and a gate electrode of the twelfth NMOS transistor MN12 are connected to a second I local oscillator signal negative electrode LO2I−.

In particular, said transimpedance amplifier comprises a first transconductance amplifier A1, a second transconductance amplifier A2, a seventh resistor R7, an eighth resistor R8, a ninth resistor R9 and a tenth resistor R10;

a positive input end of the first transconductance amplifier A1 is connected to the drain electrode of the tenth NMOS transistor MN10, and a negative input end is connected to the drain electrode of the thirteenth NMOS transistor MN13; a positive electrode of the seventh resistor R7 is connected to the positive input end of the first transconductance amplifier A1, and a negative electrode is connected to a negative output end of the first transconductance amplifier A1; a positive electrode of the eighth resistor R8 is connected to the negative input end of the first transconductance amplifier A1, and a negative electrode is connected to a positive output end of the first transconductance amplifier A1; the positive output end of the first transconductance amplifier A1 is an I output positive electrode OUTIP, and the negative output end is an I output negative electrode OUTIN;

a positive input end of the second transconductance amplifier A2 is connected to the drain electrode of the eighth NMOS transistor MN8, and a negative input end is connected to the drain electrode of the fifteenth NMOS transistor MN15; a positive electrode of the ninth resistor R9 is connected to the positive input end of the second transconductance amplifier A2, and a negative electrode is connected to a negative output end of the second transconductance amplifier A2; a positive electrode of the tenth resistor R10 is connected to the positive input end of the second transconductance amplifier A2, and a negative electrode is connected to a positive output end of the second transconductance amplifier A2; and the positive output end of the second transconductance amplifier A2 is a Q output positive electrode OUTQP, and the negative output end is a Q output negative electrode OUTQN.

Beneficial effects: The low power supply voltage double-conversion radio frequency receiving front end provided in the present invention can work at a lower power supply voltage in a passive frequency conversion mode; a first frequency conversion unit and a second frequency conversion unit of the front end are directly cascaded, and a second orthogonal passive frequency conversion shifts a low input impedance of a transimpedance amplifier to an intermediate frequency, so as to construct a band-pass filtering function for radio frequency current; and compared with the traditional active+active or active+passive double conversion mode, the present invention omits intermediate-stage active circuits and filtering circuits, thereby saving power consumption and layout area, and realizing sufficient rejection on an image signal while ensuring a high conversion gain.

DETAILED DESCRIPTION OF THE EMBODIMENTS

The present invention will be further described hereinbelow in conjunction with the accompanying drawings.

Figure 1:
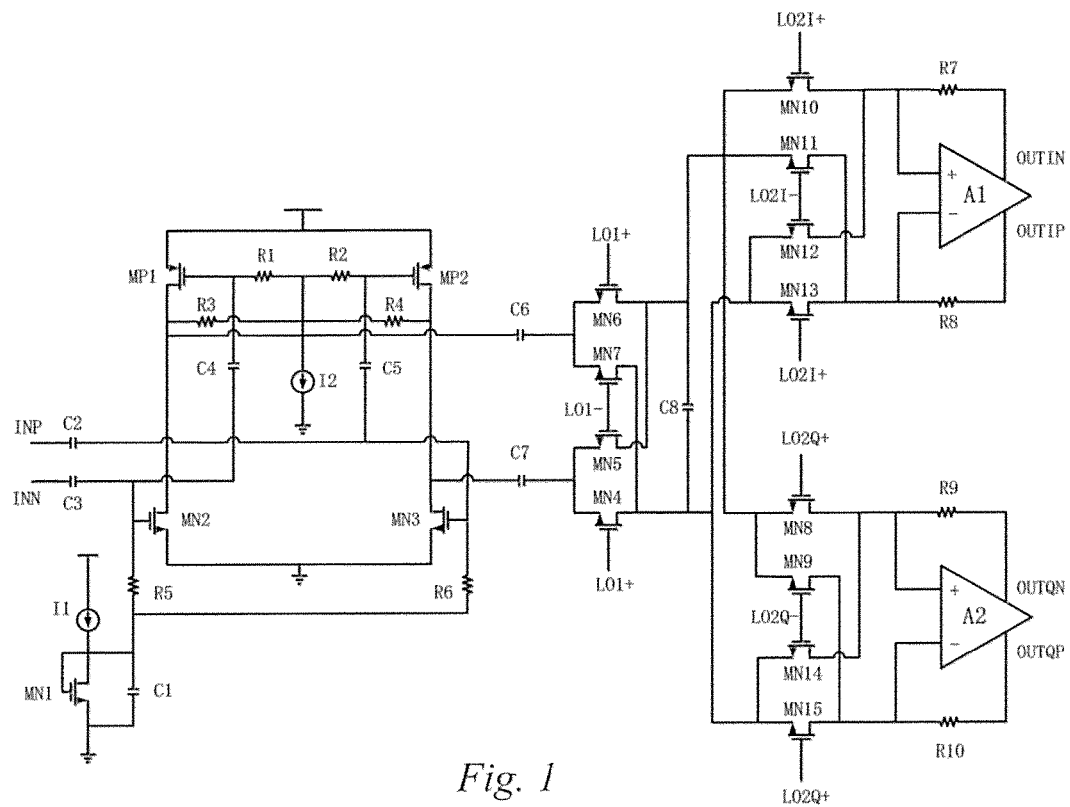
FIG. 1 is a structural diagram of a low power supply voltage double-conversion radio frequency receiving front end circuit of the present invention.

FIG. 1 shows a low power supply voltage double-conversion radio frequency receiving front end, comprising a low voltage radio frequency transconductance amplifier, a pair of double-conversion frequency mixing switches and a transimpedance amplifier, wherein the double-conversion frequency mixing switches directly cascade a first frequency conversion unit and a second frequency conversion unit, the second frequency conversion unit shifting low input impedance of the transimpedance amplifier to an intermediate frequency, so as to construct a band-pass filtering function for radio frequency current; and the radio frequency current which has undergone two frequency conversions is converted into an output intermediate frequency voltage via the transimpedance amplifier.

The low voltage radio frequency transconductance amplifier in the present application adopts a CMOS structure in which NMOS transistors and PMOS transistors simultaneously provide transconductance, wherein the PMOS transconductance transistors adopt a self-bias structure. In order to save a voltage margin so as to be adapted to a low power supply voltage application, in the present application, a fixed current source is added to a gate electrode of a PMOS transistor, wherein this current source causes a gate electrode bias voltage to be lower than a drain electrode voltage, so that more voltage margin is released.

The pair of double-conversion frequency mixing switches are composed of two stages of double-balanced local oscillator switches in cascade, and adopts a passive frequency conversion mode. The first stage is a single path structure, and the second stage is an orthogonal frequency mixing structure. The second-stage switch shifts an input impedance of the transimpedance amplifier to the vicinity of an intermediate frequency, so as to construct, at an output end of the first-stage local oscillator switch, a band-pass frequency response at the intermediate frequency. The band-pass frequency response is derived from a low frequency response directly through frequency shifting, and therefore a relatively high Q value is obtained at the output end of the first-stage local oscillator switch. Finally, an image rejection ratio above 50 dB can be achieved. The first-stage switch then shifts a low impedance at the intermediate frequency to the vicinity of an input radio frequency, so as to construct a low impedance node at a transconductance-stage output end and absorb radio frequency current into the first local oscillator stage.

The transimpedance amplifier is constituted by connecting a resistor across an input end and an output end of a fully differential transconductance amplifier, and converts down-converted current into an output voltage. A low voltage main-slave structure transconductance amplifier structure adopted in this transconductance amplifier structure is a prior patent of the inventor.

In one of the embodiments, said low voltage radio frequency transconductance amplifier comprises a first NMOS transistor MN1, a second NMOS transistor MN2, a third NMOS transistor MN3, a first PMOS transistor MP1, a second PMOS transistor MP2, a first capacitor C1, a second capacitor C2, a third capacitor C3, a fourth capacitor C4, a fifth capacitor C5, a first resistor R1, a second resistor R2, a third resistor R3, a fourth resistor R4, a fifth resistor R5, a sixth resistor R6, a first reference current source I1 and a second reference current source I2.

In detail, a gate electrode and a drain electrode of the first NMOS transistor MN1 are short-connected, and a source electrode is grounded. A source electrode of the second NMOS transistor MN2 is grounded, a gate electrode is connected to a positive electrode of the fifth resistor R5, and a drain electrode is connected to a drain electrode of the first PMOS transistor MP1. A negative electrode of the fifth resistor R5 is connected to the drain electrode of the first NMOS transistor MN1. A source electrode of the third NMOS transistor MN3 is grounded, a gate electrode is connected to a positive electrode of the sixth resistor R6, and a drain electrode is connected to a drain electrode of the second PMOS transistor MP2. A negative electrode of the sixth resistor R6 is connected to the drain electrode of the first NMOS transistor MN1. A source electrode of the first PMOS transistor MP1 is connected to a power supply VDD, and a gate electrode is connected to a positive electrode of the first resistor R1. A source electrode of the second PMOS transistor MP2 is connected to the power supply VDD, and a gate electrode is connected to a positive electrode of the second resistor R2. A positive electrode of the first capacitor C1 is connected to the drain electrode of the first NMOS transistor MN1, and a negative electrode is grounded. A positive electrode of the second capacitor C2 is connected to an input voltage positive electrode INP, and a negative electrode is connected to a gate electrode of the third NMOS transistor MN3. A positive electrode of the third capacitor C3 is connected to an input voltage negative electrode INN, and a negative electrode is connected to the gate electrode of the second NMOS transistor MN2. A positive electrode of the fourth capacitor C4 is connected to the gate electrode of the second NMOS transistor MN2, and a negative electrode is connected to the gate electrode of the first NMOS transistor MN1. A positive electrode of the fifth capacitor C5 is connected to the gate electrode of the third NMOS transistor MN3, and a negative electrode is connected to the gate electrode of the second NMOS transistor MN2. A positive electrode of the first reference current source I1 is connected to the power supply VDD, and a negative electrode is connected to the drain electrode of the first NMOS transistor MN1. A positive electrode of the second reference current source I2 is connected to a negative electrode of the first resistor R1, a negative electrode of the second resistor R2, a negative electrode of the third resistor R3 and a negative electrode of the fourth resistor R4, and a negative electrode is grounded. In addition, a positive electrode of the third resistor R3 is connected to the drain electrode of the first PMOS transistor MP1, and a positive electrode of the fourth resistor R4 is connected to the drain electrode of the second PMOS transistor MP2.

In the embodiment, said pair of double-conversion frequency mixing switches comprise a sixth capacitor C6, a seventh capacitor C7, an eighth capacitor C8, a fourth NMOS transistor MN4, a fifth NMOS transistor MN5, a sixth NMOS transistor MN6, a seventh NMOS transistor MN7, an eighth NMOS transistor MN8, a ninth NMOS transistor MN9, a tenth NMOS transistor MN10, an eleventh NMOS transistor MN11, a twelfth NMOS transistor MN12, a thirteenth NMOS transistor MN13, a fourteenth NMOS transistor MN14 and a fifteenth NMOS transistor MN15.

In detail, a positive electrode of the sixth capacitor C6 is connected to the drain electrode of the first PMOS transistor MP1, and a negative electrode is connected to a source electrode of the sixth NMOS transistor MN6 and a source electrode of the seventh NMOS transistor MN7. A positive electrode of the seventh capacitor C7 is connected to the drain electrode of the second PMOS transistor MP2, and a negative electrode is connected to a source electrode of the fourth NMOS transistor MN4 and a source electrode of the fifth NMOS transistor MN5. A positive electrode of the eighth capacitor C8 is connected to a drain electrode of the fifth NMOS transistor MN5 and a drain electrode of the sixth NMOS transistor MN6, and a negative electrode is connected to a drain electrode of the fourth NMOS transistor MN4 and a drain electrode of the seventh NMOS transistor MN7.

A gate electrode of the fourth NMOS transistor MN4 and a gate electrode of the sixth NMOS transistor MN6 are connected to a first local oscillator signal positive electrode LO1+, and a gate electrode of the fifth NMOS transistor MN5 and a gate electrode of the seventh NMOS transistor MN7 are connected to a first local oscillator signal negative electrode LO1-.

Furthermore, the positive electrode of the eighth capacitor C8 is connected to a source electrode of the eighth NMOS transistor MN8 and a source electrode of the ninth NMOS transistor MN9, and the negative electrode is connected to a source electrode of the fourteenth NMOS transistor MN14 and a source electrode of the fifteenth NMOS transistor MN15. A drain electrode of the eighth NMOS transistor MN8 and a drain electrode of the fourteenth NMOS transistor MN14 are short-connected, a drain electrode of the ninth NMOS transistor MN9 and a drain electrode of the fifteenth NMOS transistor MN15 are short-connected, a gate electrode of the eighth NMOS transistor MN8 and a gate electrode of the fifteenth NMOS transistor MN15 are connected to a second Q local oscillator signal positive electrode LO2Q+, and a gate electrode of the ninth NMOS transistor MN9 and a gate electrode of the fourteenth NMOS transistor MN14 are connected to a second Q local oscillator signal negative electrode LO2Q-.

Moreover, the positive electrode of the eighth capacitor C8 is connected to a source electrode of the tenth NMOS transistor MN10 and a source electrode of the eleventh NMOS transistor MN11, and the negative electrode is connected to a source electrode of the twelfth NMOS transistor MN12 and a source electrode of the thirteenth NMOS transistor MN13. A drain electrode of the tenth NMOS transistor MN10 and a drain electrode of the twelfth NMOS transistor MN12 are short-connected, a drain electrode of the eleventh NMOS transistor MN11 and a drain electrode of the thirteenth NMOS transistor MN13 are short-connected, a gate electrode of the tenth NMOS transistor MN10 and a gate electrode of the thirteenth NMOS transistor MN13 are connected to a second I local oscillator signal positive electrode LO2I+, and a gate electrode of the eleventh NMOS transistor MN11 and a gate electrode of the twelfth NMOS transistor MN12 are connected to a second I local oscillator signal negative electrode LO2I-.

In the embodiment, said transimpedance amplifier comprises a first transconductance amplifier A1, a second transconductance amplifier A2, a seventh resistor R7, an eighth resistor R8, a ninth resistor R9 and a tenth resistor R10.

In detail, a positive input end of the first transconductance amplifier A1 is connected to the drain electrode of the tenth NMOS transistor MN10, and a negative input end is connected to the drain electrode of the thirteenth NMOS transistor MN13; a positive electrode of the seventh resistor R7 is connected to the positive input end of the first transconductance amplifier A1, and a negative electrode is connected to a negative output end of the first transconductance amplifier A1. A positive electrode of the eighth resistor R8 is connected to the negative input end of the first transconductance amplifier A1, and a negative electrode is connected to a positive output end of the first transconductance amplifier A1. The positive output end of the first transconductance amplifier A1 is an I output positive electrode OUTIP, and the negative output end is an I output negative electrode OUTIN. A positive input end of the second transconductance amplifier A2 is connected to the drain electrode of the eighth NMOS transistor MN8, and a negative input end is connected to the drain electrode of the fifteenth NMOS transistor MN15. A positive electrode of the ninth resistor R9 is connected to the positive input end of the second transconductance amplifier A2, and a negative electrode is connected to a negative output end of the second transconductance amplifier A2. A positive electrode of the tenth resistor R10 is connected to the positive input end of the second transconductance amplifier A2, and a negative electrode is connected to a positive output end of the second transconductance amplifier A2. In addition, the positive output end of the second transconductance amplifier A2 is a Q output positive electrode OUTQP, and the negative output end is a Q output negative electrode OUTQN.

Figure 2:
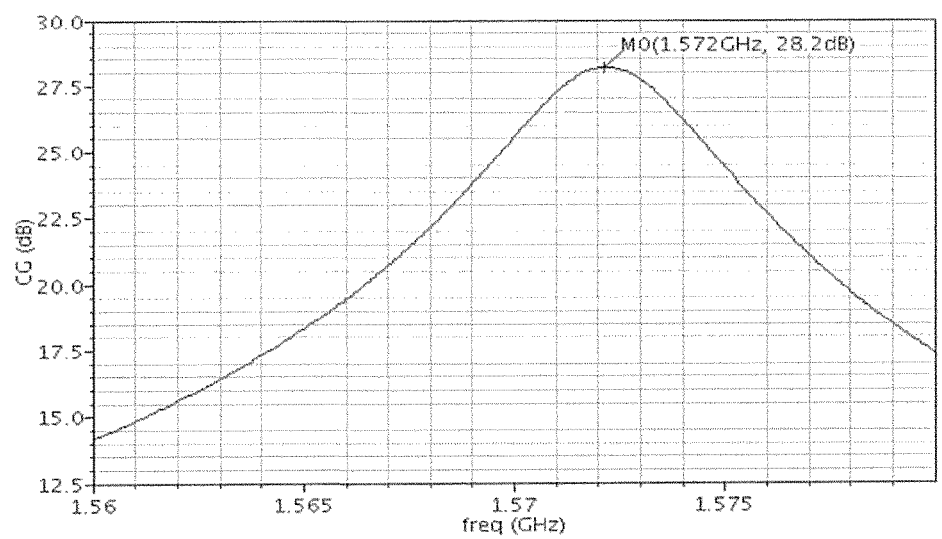
FIG. 2 is a conversion gain curve of a low power supply voltage double-conversion radio frequency receiving front end circuit of the present invention.
Figure 3:
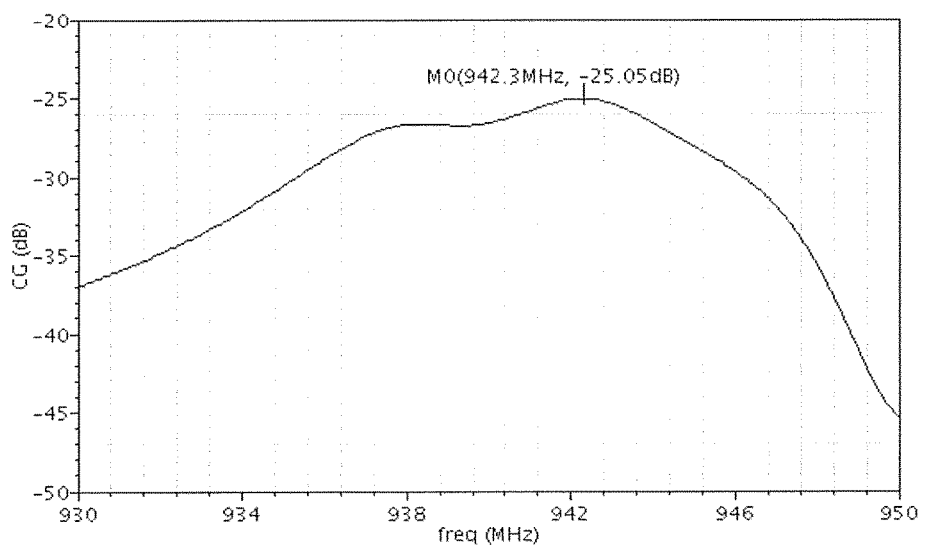
FIG. 3 is a conversion gain curve at an input image frequency of the present invention.

FIG. 1 shows a schematic diagram of a circuit structure of the present application. FIG. 2 shows a conversion gain curve of a low power supply voltage double-conversion radio frequency receiving front end circuit of the present application, in which figure, freq represents an input frequency, CG represents a conversion gain, and MO represents a measurement value. It can be seen from the figure that: at a low power supply voltage of 0.6 V, the conversion gain of the front end circuit of the present application on an input signal at the vicinity of 1.575 GHz can be up to 28 dB. FIG. 3 shows a conversion gain curve of a low power supply voltage double-conversion radio frequency receiving front end circuit of the present application at an input image frequency, in which figure, freq represents an input frequency, CG represents a conversion gain, and MO represents a measurement value. It can be seen from the figure that: the conversion gain of the radio frequency front end of the present application on an image signal at the vicinity of 940 MHz is below −25 dB, and an equivalent image rejection ratio thereof is above 53 dB.

The foregoing descriptions are merely illustrative of the exemplary embodiments of the invention, and it should be noted that: for those skilled in the art, various modifications and improvements can be made without departing from the principle of the present invention, which should be construed as falling within the protection scope of the present invention.

What is claimed is:
1. A low power supply voltage double-conversion radio frequency receiving front end, comprising:
a low voltage radio frequency transconductance amplifier;

a pair of double-conversion frequency mixing switches; and
a transimpedance amplifier,
wherein the double-conversion frequency mixing switches are coupled between the low voltage radio frequency transconductance amplifier and the transimpedance amplifier and shift low input impedance of the transimpedance amplifier to an intermediate frequency, so as to construct a band-pass filtering function for radio frequency current, and
the radio frequency current which has undergone two frequency conversions of the double-conversion frequency mixing switches is converted into an output intermediate frequency voltage via the transimpedance amplifier,
wherein said low voltage radio frequency transconductance amplifier comprises a first NMOS transistor, a second NMOS transistor, a third NMOS transistor, a first PMOS transistor, a second PMOS transistor, a first capacitor, a second capacitor, a third capacitor, a fourth capacitor, a fifth capacitor, a first resistor, a second resistor, a third resistor, a fourth resistor, a fifth resistor, a sixth resistor R6, a first reference current source and a second reference current source, wherein
a gate electrode and a drain electrode of the first NMOS transistor are short-connected, and a source electrode is grounded;
a source electrode of the second NMOS transistor is grounded, a gate electrode is connected to a positive electrode of the fifth resistor, and a drain electrode is connected to a drain electrode of the first PMOS transistor; a negative electrode of the fifth resistor is connected to the drain electrode of the first NMOS transistor;
a source electrode of the third NMOS transistor is grounded, a gate electrode is connected to a positive electrode of the sixth resistor, and a drain electrode is connected to a drain electrode of the second PMOS transistor; a negative electrode of the sixth resistor is connected to the drain electrode of the first NMOS transistor;
a source electrode of the first PMOS transistor is connected to a power supply, and a gate electrode is connected to a positive electrode of the first resistor;
a source electrode of the second PMOS transistor is connected to the power supply, and a gate electrode is connected to a positive electrode of the second resistor;
a positive electrode of the first capacitor is connected to the drain electrode of the first NMOS transistor, and a negative electrode is grounded;
a positive electrode of the second capacitor is connected to an input voltage positive electrode, and a negative electrode is connected to a gate electrode of the third NMOS transistor;
a positive electrode of the third capacitor is connected to an input voltage negative electrode, and a negative electrode is connected to the gate electrode of the second NMOS transistor;
a positive electrode of the fourth capacitor is connected to the gate electrode of the second NMOS transistor, and a negative electrode is connected to the gate electrode of the first NMOS transistor;
a positive electrode of the fifth capacitor is connected to the gate electrode of the third NMOS transistor, and a negative electrode is connected to the gate electrode of the second NMOS transistor;

a positive electrode of the first reference current source is connected to the power supply, and a negative electrode is connected to the drain electrode of the first NMOS transistor;
a positive electrode of the second reference current source is connected to a negative electrode of the first resistor, a negative electrode of the second resistor, a negative electrode of the third resistor and a negative electrode of the fourth resistor, and a negative electrode is grounded; and a positive electrode of the third resistor is connected to the drain electrode of the first PMOS transistor, and a positive electrode of the fourth resistor is connected to the drain electrode of the second PMOS transistor.

2. The low power supply voltage double-conversion radio frequency receiving front end according to claim 1, wherein said pair of double-conversion frequency mixing switches comprise a sixth capacitor, a seventh capacitor, an eighth capacitor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a twelfth NMOS transistor, a thirteenth NMOS transistor, a fourteenth NMOS transistor and a fifteenth NMOS transistor,
wherein a positive electrode of the sixth capacitor is connected to the drain electrode of the first PMOS transistor, and a negative electrode is connected to a source electrode of the sixth NMOS transistor and a source electrode of the seventh NMOS transistor;
a positive electrode of the seventh capacitor is connected to the drain electrode of the second PMOS transistor, and a negative electrode is connected to a source electrode of the fourth NMOS transistor and a source electrode of the fifth NMOS transistor;
a positive electrode of the eighth capacitor is connected to a drain electrode of the fifth NMOS transistor and a drain electrode of the sixth NMOS transistor MN6, and a negative electrode is connected to a drain electrode of the fourth NMOS transistor and a drain electrode of the seventh NMOS transistor;
a gate electrode of the fourth NMOS transistor and a gate electrode of the sixth NMOS transistor are connected to a first local oscillator signal positive electrode, and a gate electrode of the fifth NMOS transistor and a gate electrode of the seventh NMOS transistor are connected to a first local oscillator signal negative electrode;
the positive electrode of the eighth capacitor is connected to a source electrode of the eighth NMOS transistor and a source electrode of the ninth NMOS transistor, and the negative electrode is connected to a source electrode of the fourteenth NMOS transistor and a source electrode of the fifteenth NMOS transistor; a drain electrode of the eighth NMOS transistor and a drain electrode of the fourteenth NMOS transistor are short-connected, a drain electrode of the ninth NMOS transistor and a drain electrode of the fifteenth NMOS transistor are short-connected, a gate electrode of the eighth NMOS transistor and a gate electrode of the fifteenth NMOS transistor are connected to a second Q local oscillator signal positive electrode, and a gate electrode of the ninth NMOS transistor and a gate electrode of the fourteenth NMOS transistor are connected to a second Q local oscillator signal negative electrode; and
the positive electrode of the eighth capacitor is connected to a source electrode of the tenth NMOS transistor and a source electrode of the eleventh NMOS transistor, and the negative electrode is connected to a source electrode of the twelfth NMOS transistor and a source electrode of the thirteenth NMOS transistor; and a drain electrode of the tenth NMOS transistor and a drain electrode of the twelfth NMOS transistor are short-connected, a drain electrode of the eleventh NMOS transistor and a drain electrode of the thirteenth NMOS transistor are short-connected, a gate electrode of the tenth NMOS transistor and a gate electrode of the thirteenth NMOS transistor are connected to a second I local oscillator signal positive electrode, and a gate electrode of the eleventh NMOS transistor and a gate electrode of the twelfth NMOS transistor are connected to a second I local oscillator signal negative electrode.

3. The low power supply voltage double-conversion radio frequency receiving front end according to claim 2, wherein said transimpedance amplifier comprises a first transconductance amplifier, a second transconductance amplifier, a seventh resistor, an eighth resistor, a ninth resistor and a tenth resistor, wherein a positive input end of the first transconductance amplifier is connected to the drain electrode of the tenth NMOS transistor, and a negative input end is connected to the drain electrode of the thirteenth NMOS transistor; a positive electrode of the seventh resistor is connected to the positive input end of the first transconductance amplifier, and a negative electrode is connected to a negative output end of the first transconductance amplifier; a positive electrode of the eighth resistor is connected to the negative input end of the first transconductance amplifier, and a negative electrode is connected to a positive output end of the first transconductance amplifier; the positive output end of the first transconductance amplifier is an I output positive electrode OUTIP, and the negative output end is an I output negative electrode;

a positive input end of the second transconductance amplifier is connected to the drain electrode of the eighth NMOS transistor, and a negative input end is connected to the drain electrode of the fifteenth NMOS transistor; a positive electrode of the ninth resistor is connected to the positive input end of the second transconductance amplifier, and a negative electrode is connected to a negative output end of the second transconductance amplifier; a positive electrode of the tenth resistor is connected to the positive input end of the second transconductance amplifier, and a negative electrode is connected to a positive output end of the second transconductance amplifier; and the positive output end of the second transconductance amplifier is a Q output positive electrode, and the negative output end is a Q output negative electrode.

* * * * *